(12) United States Patent
Garland et al.

(10) Patent No.: US 6,204,448 B1
(45) Date of Patent: Mar. 20, 2001

(54) HIGH FREQUENCY MICROWAVE PACKAGING HAVING A DIELECTRIC GAP

(75) Inventors: Paul Garland, San Diego; James Kyo Long, El Cajon; Yozo Satoda, San Diego; Chong-il Park, Poway, all of CA (US)

(73) Assignee: Kyocera America, Inc., San Diego, CA (US)

( * ) Notice: Subject to any disclaimer, the term of this patent is extended or adjusted under 35 U.S.C. 154(b) by 0 days.

(21) Appl. No.: 09/205,903

(22) Filed: Dec. 4, 1998

(51) Int. Cl.[7] ...................................................... H05K 5/06
(52) U.S. Cl. ........................ 174/52.3; 257/693; 257/698; 174/52.4; 333/247
(58) Field of Search ................................. 174/52.2, 52.4, 174/260, 255, 52.3; 257/692, 693, 698, 699, 708; 333/247; 361/772, 773, 774

(56) References Cited

U.S. PATENT DOCUMENTS

| 4,172,261 | 10/1979 | Tsuzuki et al. . |
| 5,117,068 | 5/1992 | Seieroe et al. . |
| 5,235,300 | 8/1993 | Chan et al. . |
| 5,387,888 | 2/1995 | Eda et al. . |
| 5,465,008 | 11/1995 | Goetz et al. . |
| 5,510,645 | 4/1996 | Fitch et al. . |
| 5,512,781 | 4/1996 | Inoue . |
| 5,536,971 | 7/1996 | Oishi et al. . |
| 5,792,984 | * 8/1998 | Bloom .................................. 174/52.3 |

\* cited by examiner

Primary Examiner—Kristine Kincaid
Assistant Examiner—Hung V Ngo
(74) Attorney, Agent, or Firm—Hogan & Hartson, L.L.P.

(57) ABSTRACT

A hermetically sealed package assembly for microwave circuits in the high microwave frequencies having a dielectric gap defined in the substrate. The package assembly comprises a substrate for carrying the circuit on a top surface, a seal ring wall carried on the top surface, a via structure provided through the substrate for transmitting high-frequency signals into and out of the package, and a conducive lead carried on the bottom surface of the substrate and passes under the seal ring wall. A dielectric gap is provided in the substrate between the seal ring wall and the lead to reduce the capacitive coupling between the lead and the wall. The gap may be a sealed cavity provided inside the substrate, or a cutout area in the substrate so that the lead is suspended in air at the location where it passes under the seal ring wall.

10 Claims, 9 Drawing Sheets

HIGH FREQUENCY MICROWAVE PACKAGING HAVING A DIELECTRIC GAP

BACKGROUND OF THE INVENTION

1. Field of the Invention

This invention relates to packaging of microwave circuits in the high microwave frequencies and in applications using hermetically sealed packages for monolithic microwave integrated circuits, and more particularly to such packages having vias for transmitting signals into and out of the packages.

2. Description of Related Art

Ultra high speed monolithic microwave integrated circuits (MMIC), microwave integrated circuits (MIC), other integrated circuits and hybrid circuit dies are mounted in environmentally protective or hermetically sealed packages that provide electromagnetic shielding and easy handling. Known manufacturing techniques include cofired ceramic enclosures using thick or thin film metallization, glass or quartz seals, ceramic enclosures using thin-film metallization, metal enclosures having ceramic feedthroughs, and metal enclosures having glass feedthroughs.

In ceramic packages generally available for MMIC's, the main contributor to poor microwave performance is the feedthrough. The insertion loss of a coaxial line or stripline formed on the feedthrough through a hermetically sealed ceramic wall increases with higher frequency, which results in a diminished signal strength. High insertion loss degrades MIC performance in many ways such as increased noise figure of small signal devices and reduced output power and efficiency of a power amplifier. An MMIC package capable of good performance in the microwave range should have low insertion loss per feedthrough.

Figure 1A:
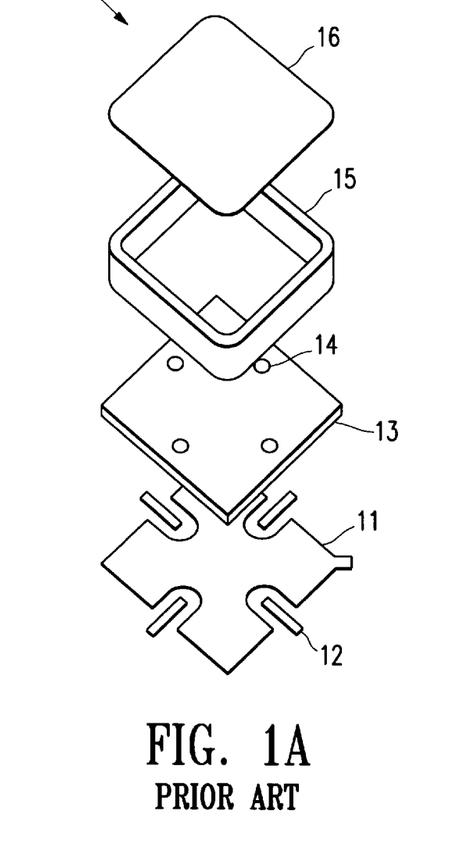
FIGS. 1A–1C show a conventional package assembly having via structures for transmitting signals.
Figure 1B:
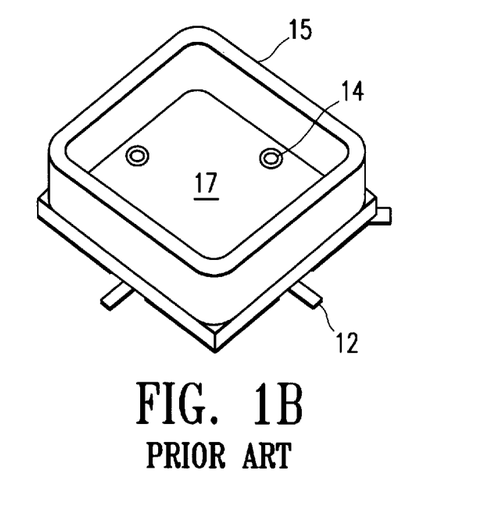
Figure 1C:
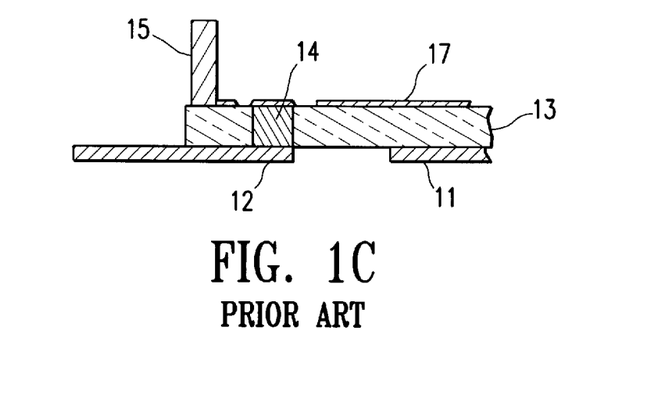

U.S. Pat. No. 5,117,068 describes a conventional packaging assembly having vias in the substrate for transmitting signals into and out of the package. As shown in FIGS. 1A–1C (exploded, perspective and cross-sectional views, respectively), the package 10 comprises a lead frame 11, leads 12 an alumina base or substrate 13 having solid metal vias 14 extending therethrough, a seal-ring wall 15 and a cover 16 mounted together. The top surface of the substrate 13 is plated with a conductive film 17.

Figure 2A:
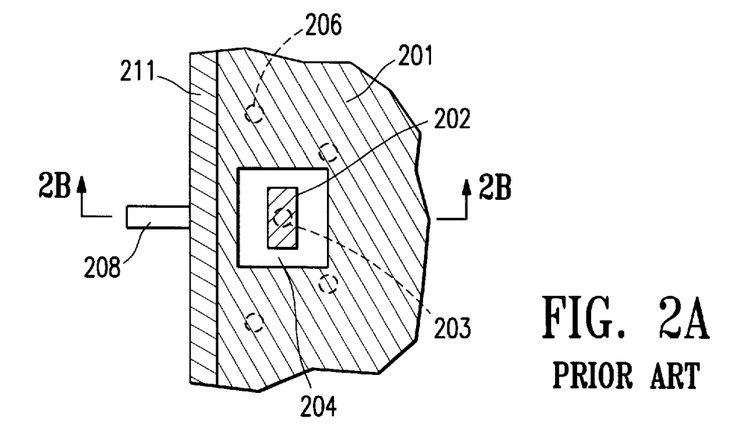
FIGS. 2A–2C show the details of a conventional via structure.
Figure 2B:
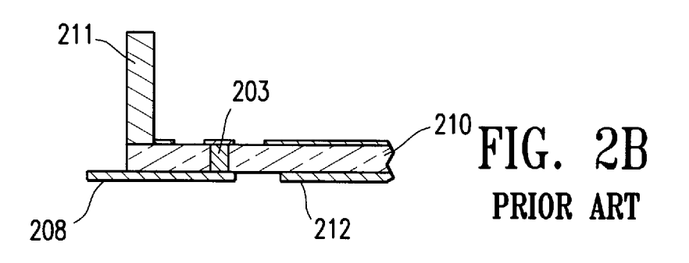
Figure 2C:
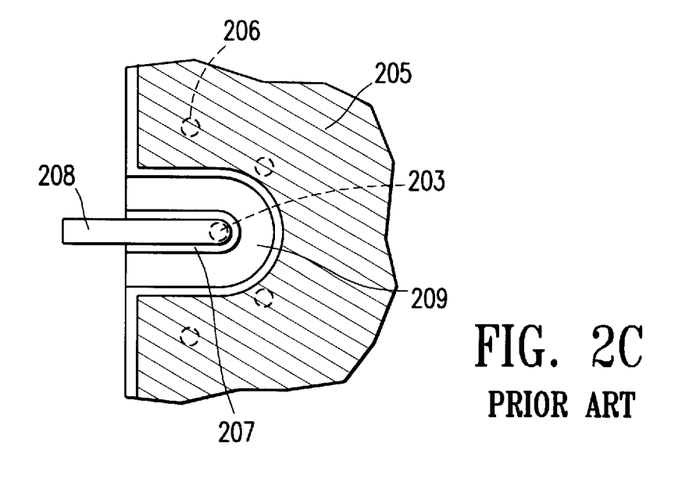

FIGS. 2A–2C show a conventional via structure for the type of packages shown in FIGS. 1A–1C. FIGS. 2A and 2C are the top and bottom views of the via structure, and FIG. 2B is a cross-sectional view along the line 2B—2B in FIG. 2A. A first metallization layer 201 is formed on the top or inside surface of the substrate 210 to serve as the ground of the device mounted in the package. A wire bond pad metallization 202 is formed over and connected to the lead via 203 and is separated from the rest of the metallization layer 201 by a gap 204. A second metallization layer 205 is formed on the bottom or outside surface of the substrate 210 as the ground. The ground metallization layers 201 and 205 on the top and bottom surfaces of the substrate 210 are electrically connected by a plurality of ground vias 206 that pass through the substrate. A lead pad metallization 207 is formed on the bottom surface separated from the ground metallization layer 205 by a gap 209 and is connected to the lead via 203. A ground plane 212 is connected to the ground metallization layer 205, and a lead 208 is connected to the lead pad 207 and extends outwardly under the seal-ring wall 211 over the edge of the substrate 210.

SUMMARY OF THE DISCLOSURE

An object of the present invention is to improve the electrical transmission of a high frequency signal through a package using a relatively inexpensive method of construction with novel geometry to extend the operable frequency range of the package.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

According to an embodiment of the present invention, an MMIC package assembly comprises a dielectric substrate having metal lead vias formed therethrough, a metal seal ring wall carried above the substrate, and a cover disposed over the seal ring wall, the package further comprising a via structure for transmitting high frequency electronic signals, the via structure including a wire bond pad metallization formed on the top or inside surface of the substrate and connected to the lead via, a lead pad metallization formed on the bottom or outside surface of the substrate and connected to the lead via, a lead on the bottom surface of the substrate connected to the lead pad metallization and extending outwardly under the seal ring wall over the edge of the substrate, and a sealed dielectric gap defined inside the substrate between the lead and the seal ring wall.

According to another embodiment of the present invention, an open dielectric gap is defined in the substrate above a portion of the leads so that the leads are partially suspended near the edge of the substrate.

According to one aspect of the invention, air or other low dielectric materials are used to constitute a gap between the metal lead and the seal ring wall. This enables the control of the ground current through a normally solid package while keeping the package hermetic.

According to another aspect of the present invention, the substrate of the package further has metallization layers formed on the top and bottom surfaces thereof to serve as the ground and ground metal vias formed through the substrate to connect the ground metallization layers. The top surface ground metallization layer is separated from the wire bond pad metallization by a dielectric gap, and the bottom surface ground metallization layer is separated from the lead pad metallization by another dielectric gap.

According to another aspect of the present invention, a ground plane is mounted on the bottom surface of the substrate and electrically connected to the ground vias to serve as the ground. The ground plane has two tabs extending parallel to the each lead on each side thereof. The gap between the ground plane and lead allows a predetermined impedance to be maintained at every point along the lead. The lead and ground plane act as a coplanar waveguide, which keeps the electric field in the plane of the bottom surface of the package.

According to another aspect of the present invention, the lead and the lead pad metallization have a strip shape and neck down to a narrower width where they pass under the dielectric gap in the substrate. This allows a predetermined impedance to be maintained everywhere along the length of the lead.

According to another aspect of the present invention, the ground vias are located as close as possible to the edge of the ground plane around the dielectric gap surrounding the lead pad metallization on the bottom face of the substrate.

According to another aspect of the present invention, the metal seal ring wall of the package has substantially uniform thickness, but is thinner in a portion where the wall passes over the lead and the surrounding coplanar waveguide.

BRIEF DESCRIPTION OF THE DRAWINGS

A detailed description of embodiments of the invention will be made with reference to the accompanying drawings, wherein like numerals designate corresponding parts in the several figures.

DETAILED DESCRIPTION OF THE PREFERRED EMBODIMENTS

Figure 3A:
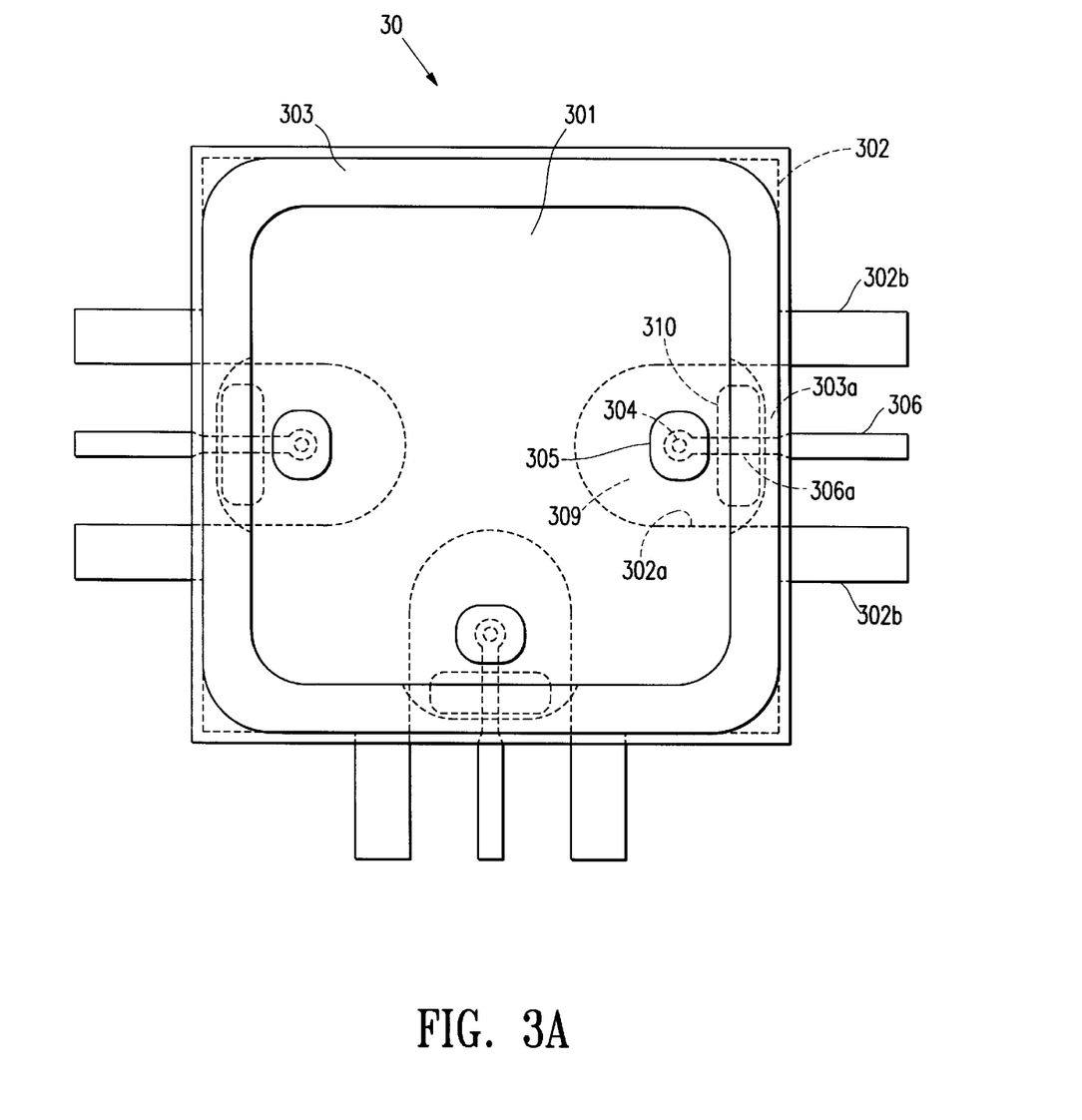
FIGS. 3A–3E illustrate a package assembly according to a first embodiment of the present invention.
Figure 3B:
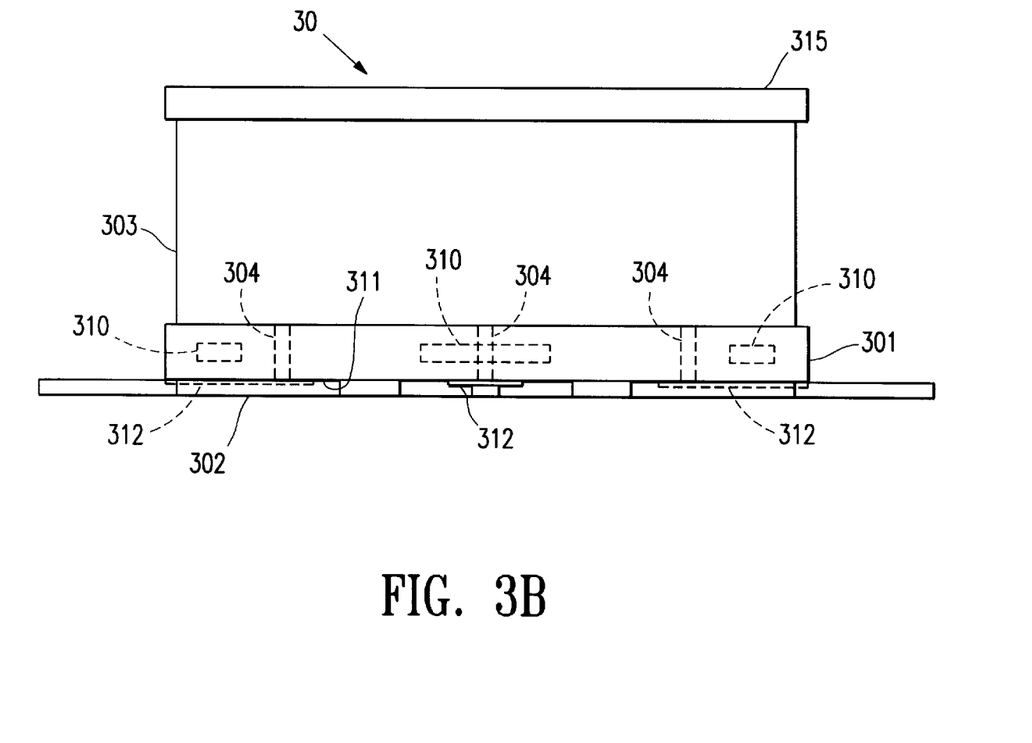
Figure 3C:
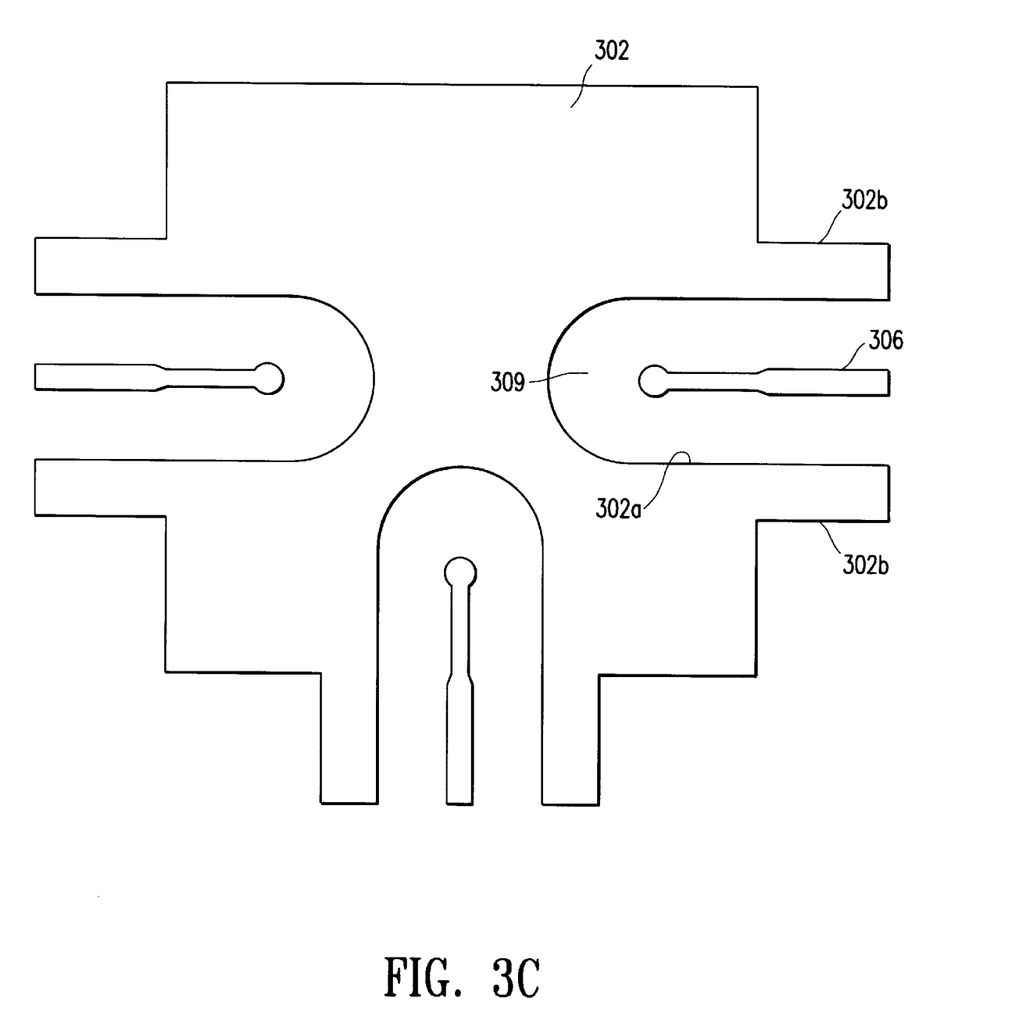
Figure 3D:
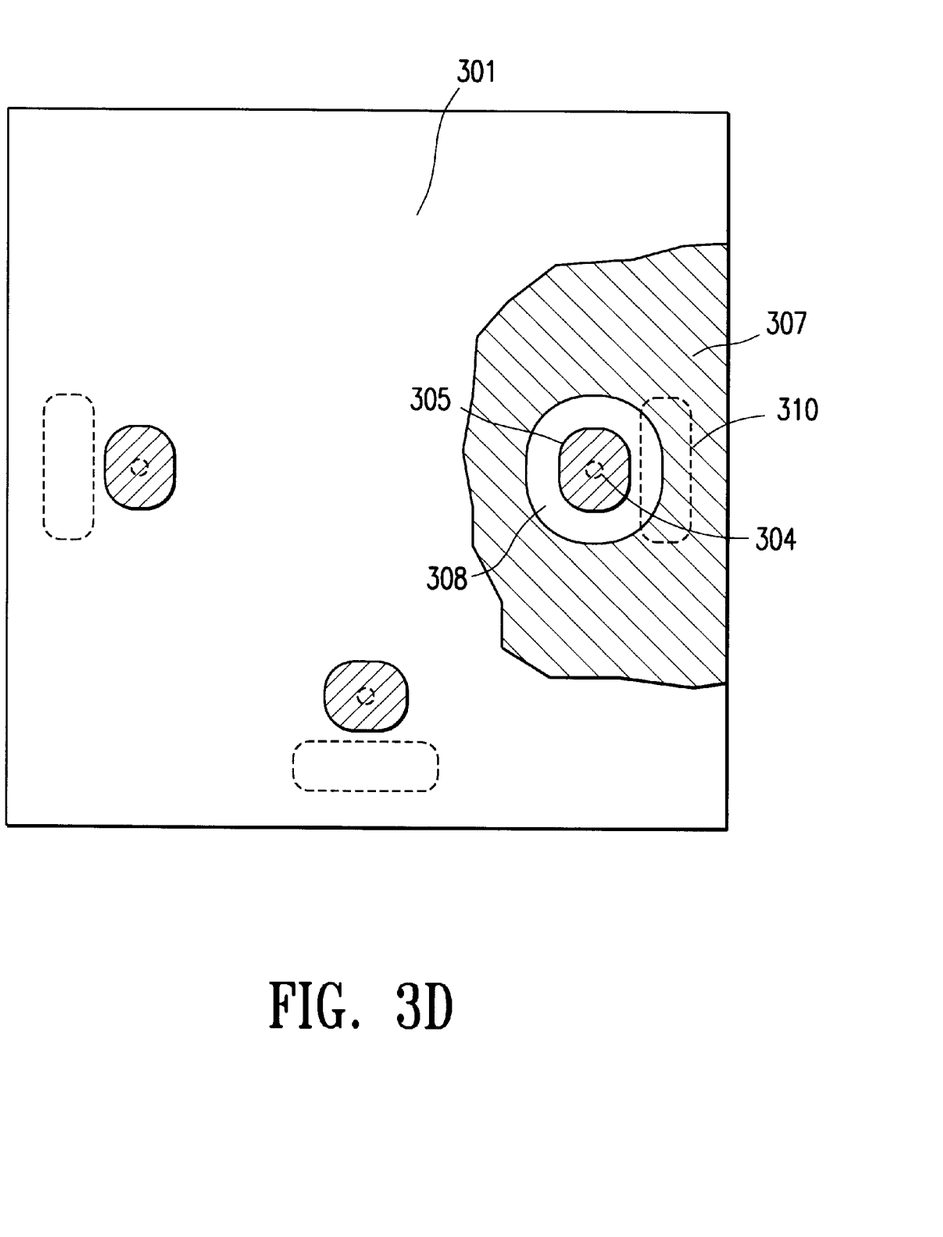
Figure 3E:
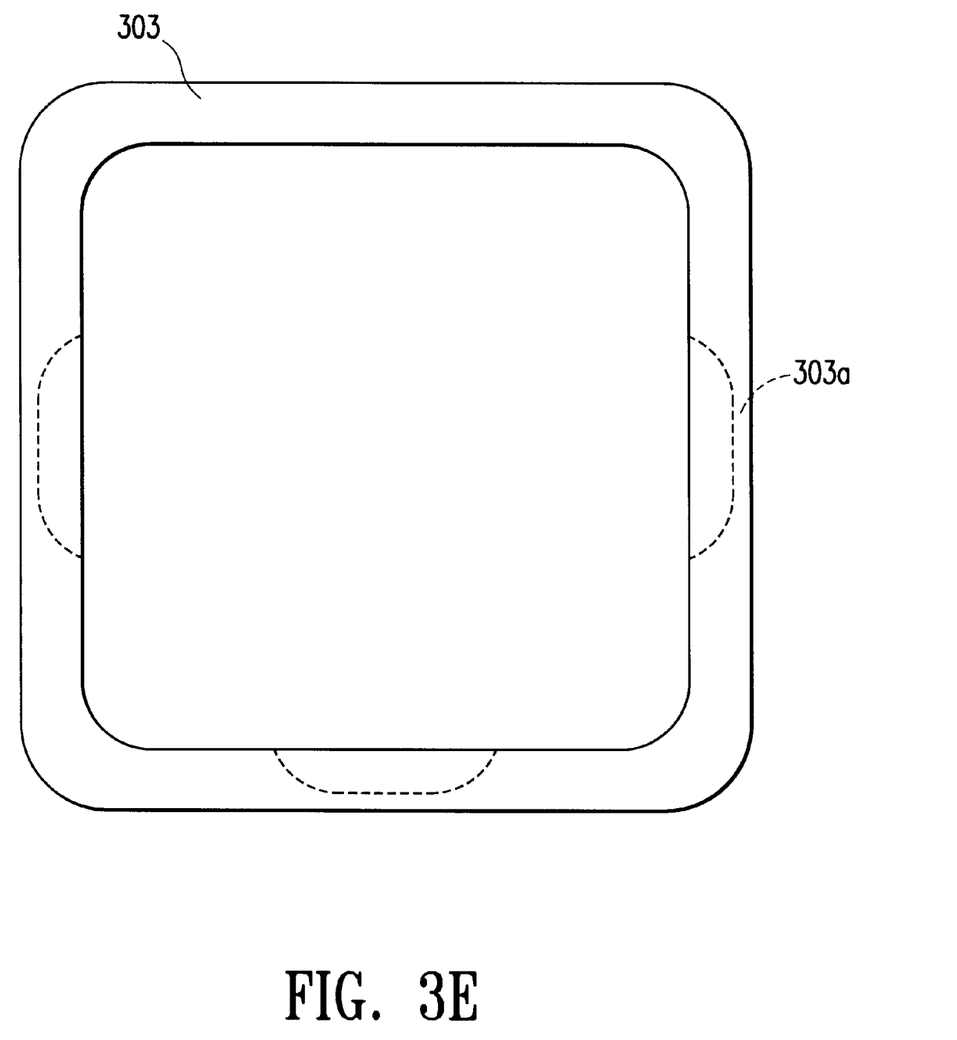

FIGS. 3A–3E illustrate a package assembly 30 according to a first embodiment of the present invention. FIGS. 3A and 3B are top and elevation view of the package assembly 30, respectively. FIG. 3C–3E are top views of the ground plane, the substrate and the seal ring wall, respectively.

As shown in FIGS. 3A–3E, the package assembly 30 includes a dielectric substrate 301, a conductive seal ring wall 303 disposed over the substrate, and a cover 315 disposed over the seal ring wall to seal the package. A plurality of lead via structures are provided on the substrate. In the illustrated embodiment, three via structures are provided, each being adjacent a side of the rectangular-shaped substrate. A different number of via structures or different geometrical arrangements may also be used. Each lead via structure comprises a conductive lead via 304 provided through the substrate, a wire bond pad metallization 305 formed on the top surface of the substrate 301 over the lead via 304 and connected thereto, and a lead pad metallization 312 formed on the bottom surface of the substrate under the lead via 304 and connected thereto.

The lead vias 304 are preferably 15 mil (0.382 mm) in diameter. The wire bond pad 305 is preferably round or oval in shape. A top ground metallization layer 307 is formed on the top surface of the substrate 301 to serve as the ground of the device to be packaged. The top ground metallization layer 307 and the wire bond pad 305 define an annular wire bond pad gap 308 therebetween to form a coaxial configuration.

A bottom ground metallization layer (not shown) is formed on the bottom surface of the substrate 301, and a conductive ground plane 302 is mounted thereon at the bottom surface of the substrate. The bottom ground metallization layer 311 and the ground plane 302 define an arch-shaped cutout area 302a under and in surrounding relationship to each lead pad metallization 312. A metal lead 306 is mounted on the lead pad metallization 312 on the bottom surface of the substrate within each cutout area 302a. The ground plane 302 and the lead 306 are mounted on the respective metallization layers by, for example, brazing. The metal lead 306 preferably has an elongated shape and extends outwardly under the seal ring wall 303 over the edge of the substrate. The ground plane 302 has two extended portions forming ground tabs 302b extending parallel to each lead 306 on each side thereof, forming lead pad dielectric gaps 309 therebetween. The gaps 309 between the lead and the ground plane are designed to maintain a predetermined impedance (preferably 50 ohm) at every point along the lead. The dielectric gaps 309 also acts as a coplanar waveguide to keep the electric field in the plane near the bottom surface of the package assembly 30.

The substrate 301 defines therein closed cavities 310 between each lead 306 on the bottom of the substrate and the seal ring wall 303 and the ground metallization layer 307 on the top of the substrate. The cavities 310 may be air-filled or filled with other suitable dielectric materials known to one of ordinary skill in the art. The cavities 310 form dielectric gaps to reduce the coupling of the electric field between the leads 306 and the seal ring wall 303. A portion 306a of each lead 306 that passes under the dielectric gap 310 is preferably narrower than other portions of the lead to maintain a predetermined impedance everywhere along its length.

As shown in FIG. 3E, the seal ring wall 303 has a substantially uniform thickness, preferably 30 mil (0.762 mm), except in portions 303a above the leads 306 and the surrounding coplanar waveguide section including the gaps 309. In the portions 303a, the seal ring wall 303 is made as thin as possible without compromising its hermeticity and mechanical integrity, and is preferably 10 mil thick (0.254 mm). This reduces the parasitic capacitance between the leads 306 and the seal ring wall 303.

The ground plane 302 and the seal ring wall 303 may be made of metal or other suitable conductive materials known to one of ordinary skill in the art. The substrate may be formed of a ceramic material, such as alumina or aluminum nitride.

Figure 4A:
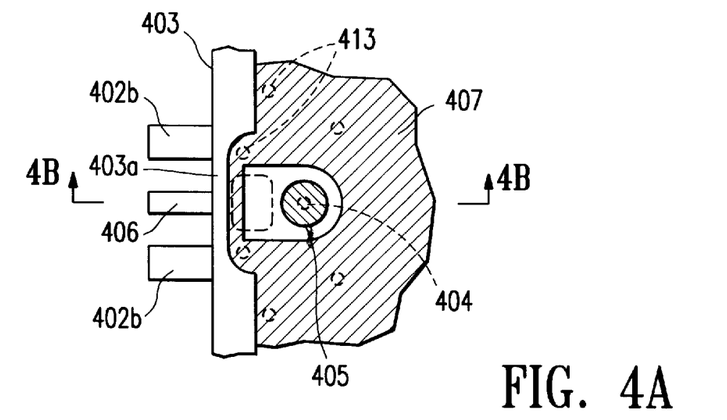
FIGS. 4A–4C illustrate a via structure according to the first embodiment of the present invention.
Figure 4B:
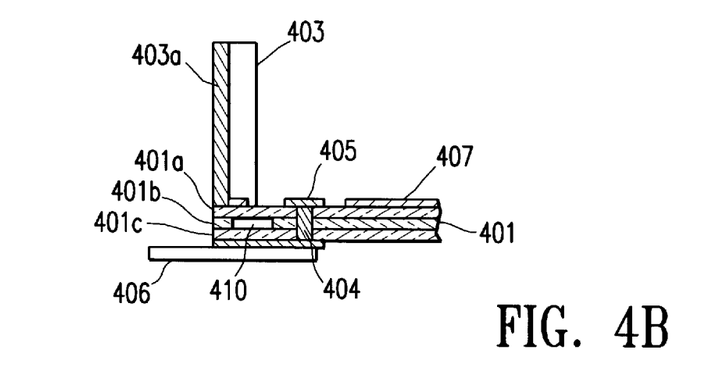
Figure 4C:
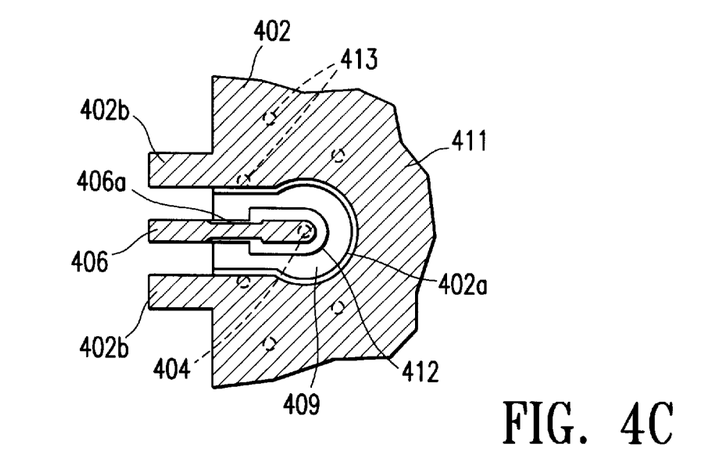

FIGS. 4A–4C illustrate a via structure according to the first embodiment of the present invention. Features of the embodiment of FIGS. 4A–4C that are similar to those of the embodiment of FIGS. 3A–3E are designated with similar numerals and are not discussed in detail. FIG. 4B is a cross-sectional view of the via structure along the line 4B—4B in FIG. 4A, and shows the substrate 401 incorporating an dielectric gap 410 therein. The substrate 401 is formed of three layers of alumina 401a–401c, wherein the middle layer 401b has a cutout portion which together with the top and bottom layers 401a and 401c define the dielectric gap 410. The three layers are adhered together using well-known methods, such as sintering.

FIGS. 4A and 4C (top and bottom views of the via structure, respectively) show metal ground vias 413 provided through the substrate for connecting the ground metallization layers 407 and 411 on the top and bottom surfaces of the substrate, respectively. The ground vias 413 are placed as close as possible to the border between the metallization layer 411 and the lead pad dielectric gap 409 on the bottom surface, preferably within 5 mil (0.127 mm).

FIGS. 4A and 4B also illustrate the seal ring wall 403 having a thinner portion 403a above the metal lead 406 and the surrounding dielectric gap 409.

Figure 5A:
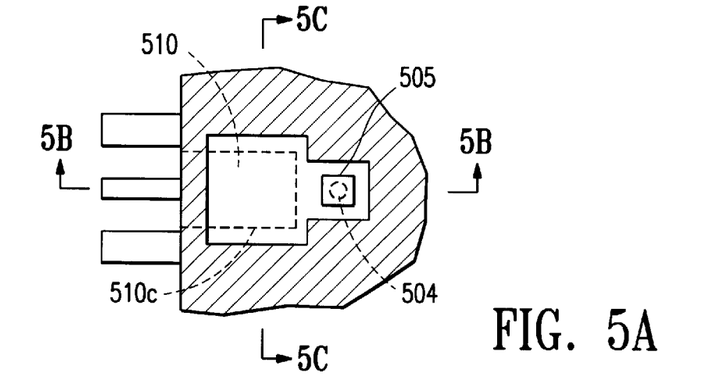
FIGS. 5A–5D illustrate a via structure according to a second embodiment of the present invention.
Figure 5B:
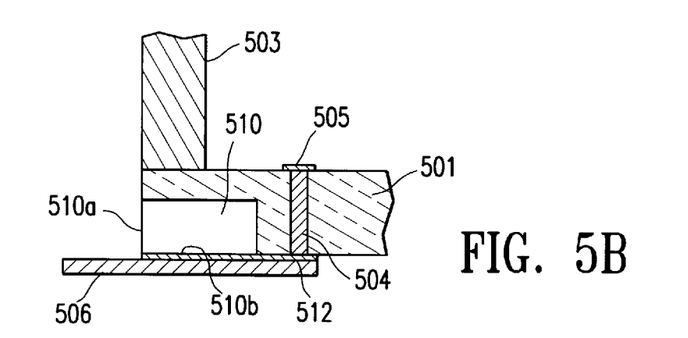
Figure 5C:
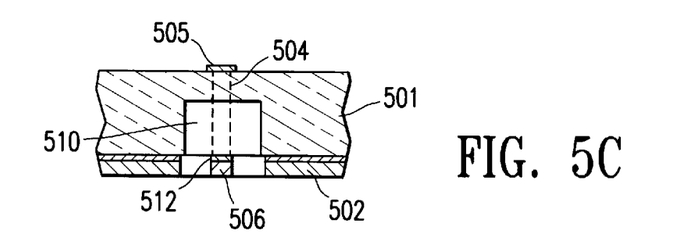
Figure 5D:
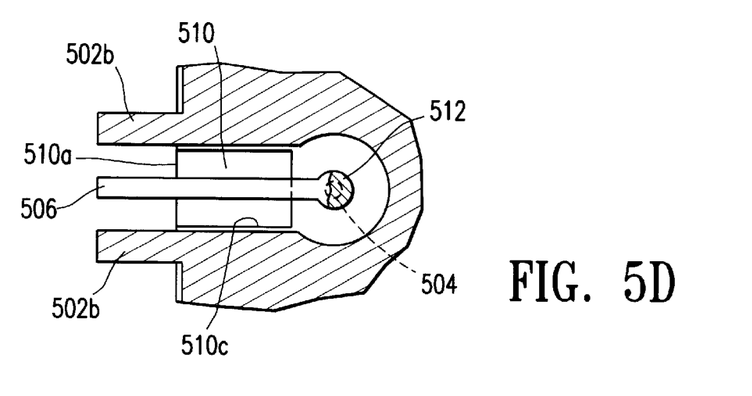

FIGS. 5A–5D illustrate a second embodiment of the present invention, in which the dielectric gap defined by the substrate is an open gap. FIGS. 5A and 5D are top and bottom views, respectively; and FIGS. 5B and 5C are sectional view along the lines 5B—5B and 5C—5C in FIG. 5A. Features of the embodiment of FIGS. 5A–4D that are similar to those of the embodiment of FIGS. 3A–3E and FIGS. 4A–4C are designated with similar numerals and are not discussed in detail.

As shown in FIG. 5A, a dielectric gap 510 is defined by a cut out area in the substrate 501 and is disposed between the lead 506 and the seal ring wall 503. Unlike in the embodiment of FIGS. 3A–3E and 4A–4C, the gap 510 is open to the outside. The gap 510 is substantially rectangular in shape, and may be considered bound at one end by a plane 510*a* along a side surface of the substrate, and at the bottom by a plane 510*b* along the bottom surface of the substrate. The two side faces 510*c* of the gap 510 preferably flush with the edges of the ground tabs 502*b*. Alternatively, the gap may have a different shape, such as arch or oval. An end portion of the lead 506 is mounted on the lead tab metallization 512 on the bottom surface of the substrate 501, but a large portion of the lead is suspended under the dielectric gap 510. By suspending the leads in the air, parasitic capacitance between the leads and the seal ring wall is reduced, and the performance of the coplanar transmission lines formed between the lead and the ground tabs is improved.

While the description above refers to particular embodiments of the present invention, it will be understood than many modification may be made without departing from the spirit thereof. For example, the geometry and dimensions of various parts may be altered. Although a via structure is described for transmitting signals into and out of the packaging, other structures or mechanisms may also be used, such as capacitive coupling between the external lead and the device inside the packaging. In addition, although described in the environment of hermetically sealed packages for microwave integrated circuits, the invention may be applied to other types of packaging assemblies and for other types of electrical devices. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A package assembly for an electric circuit comprising:
a substrate having a first surface for carrying the electric circuit and a second surface opposite the first surface;
a conductive side wall carried on the first surface of the substrate; and
at least one lead carried on the second surface of the substrate,
wherein the substrate defines at least one gap disposed between the lead and the conductive side wall, the gap defined by the substrate is a sealed cavity inside the substrate, the substrate comprises three layers of a dielectric material, and a middle layer defines a cutout area which together with a top and a bottom layer form the sealed cavity.

2. A package assembly for an electric circuit comprising:
a substrate having a first surface for carrying the electric circuit and a second surface opposite the first surface;
a conductive side wall carried on the first surface of the substrate; and
at least one lead carried on the second surface of the substrate,
wherein the substrate defines at least one gap disposed between the lead and the conductive side wall, the gap defined by the substrate is a sealed cavity inside the substrate, and the sealed cavity is filled with a dielectric material.

3. A package assembly for an electric circuit comprising:
a substrate having a first surface for carrying the electric circuit and a second surface opposite the first surface;
a conductive side wall carried on the first surface of the substrate:
and at least one lead carried on the second surface of the substrate;
wherein the substrate defines at least one gap disposed between the lead and the conductive side wall, the gap defined by the substrate is a sealed cavity inside the substrate, and the sealed cavity is filled with air.

4. A package assembly for an electric circuit comprising:
a substrate having a first surface for carrying the electric circuit and a second surface opposite the first surface;
a conductive side wall carried on the first surface of the substrate;
at least one lead carried on the second surface of the substrate,
wherein the substrate defines at least one gap disposed between the lead and the conductive side wall;
at least one conductive wire bond pad formed on the first surface of the substrate;
at least one conductive lead pad formed on the second surface of the substrate, wherein the lead is mounted on the lead pad; and
at least one coupling structure for transmitting signals between a conductive wire bond pad and the lead,
wherein the lead extends along the second surface of the substrate and overlaps the conductive side wall at an overlapping position when viewed in a normal direction of the first surface of the substrate, and wherein the gap defined by the substrate is located adjacent the overlapping location when viewed in the normal direction of the first surface of the substrate; and
wherein a portion of the lead adjacent the overlapping position between the lead and the conductive side wall is narrower than other portions of the lead.

5. A package assembly for an electric circuit comprising:
a substrate having a first surface for carrying the electric circuit and a second surface opposite the first surface;
a conductive side wall carried on the first surface of the substrate;
at least one lead carried on the second surface of the substrate,
wherein the substrate defines at least one gap disposed between the lead and the conductive side wall;
at least one conductive wire bond pad formed on the first surface of the substrate;
at least one conductive lead pad formed on the second surface of the substrate, wherein the lead is mounted on the lead pad; and
at least one coupling structure for transmitting signals between a conductive wire bond pad and the lead,
wherein the lead extends along the second surface of the substrate and overlaps the conductive side wall at an overlapping position when viewed in a normal direction of the first surface of the substrate, and wherein the gap defined by the substrate is located adjacent the overlapping location when viewed in the normal direction of the first surface of the substrate; and
wherein a portion of the conductive side wall adjacent the overlapping position between the lead and the conductive side wall is thinner than other portions of the side wall.

6. In an electric circuit package assembly having a substrate having a top and a bottom surface and a seal ring wall disposed above the substrate, a structure for transmitting high frequency signals into and out of the package assembly, comprising:

a lead via formed through the substrate and filled with a conductive material;

a conductive wire bond pad formed on the top surface of the substrate over the lead via and electrically connected thereto;

a conductive lead pad formed on the bottom surface of the substrate under the lead via and electrically connected thereto; and a lead mounted on the lead pad on the bottom surface of the substrate, the lead extending toward an edge of the substrate and passing under the seal ring wall, wherein the substrate defines a dielectric gap disposed between the lead and the seal ring wall, the dielectric gap defined by the substrate is a sealed cavity inside the substrate, the substrate comprises three layers of a dielectric material, and a middle layer defines a cutout area which together with a top and a bottom layer form the sealed cavity.

7. In an electric circuit package assembly having a substrate having a top and a bottom surface and a seal ring wall disposed above the substrate, a structure for transmitting high frequency signals into and out of the package assembly, comprising:

a lead via formed through the substrate and filled with a conductive material;

a conductive wire bond pad formed on the top surface of the substrate over the lead via and electrically connected thereto;

a conductive lead pad formed on the bottom surface of the substrate under the lead via and electrically connected thereto; and a lead mounted on the lead pad on the bottom surface of the substrate, the lead extending toward an edge of the substrate and passing under the seal ring wall, wherein the substrate defines a dielectric gap disposed between the lead and the seal ring wall, the dielectric gap defined by the substrate is a sealed cavity inside the substrate, and the sealed cavity is filled with a dielectric material.

8. In an electric circuit package assembly having a substrate having a top and a bottom surface and a seal ring wall disposed above the substrate, a structure for transmitting high frequency signals into and out of the package assembly, comprising:

a lead via formed through the substrate and filled with a conductive material;

a conductive wire bond pad formed on the top surface of the substrate over the lead via and electrically connected thereto;

a conductive lead pad formed on the bottom surface of the substrate under the lead via and electrically connected thereto; and a lead mounted on the lead pad on the bottom surface of the substrate, the lead extending toward an edge of the substrate and passing under the seal ring wall, wherein the substrate defines a dielectric gap disposed between the lead and the seal ring wall, the dielectric gap defined by the substrate is a sealed cavity inside the substrate, and the sealed cavity is filled with air.

9. In an electric circuit package assembly having a substrate having a top and a bottom surface and a seal ring wall disposed above the substrate, a structure for transmitting high frequency signals into and out of the package assembly, comprising:

a lead via formed through the substrate and filled with a conductive material;

a conductive wire bond pad formed on the top surface of the substrate over the lead via and electrically connected thereto;

a conductive lead pad formed on the bottom surface of the substrate under the lead via and electrically connected thereto; and a lead mounted on the lead pad on the bottom surface of the substrate, the lead extending toward an edge of the substrate and passing under the seal ring wall, and a portion of the lead passing under the seal ring wall is narrower than other portions of the lead.

10. In an electric circuit package assembly having a substrate having a top and a bottom surface and a seal ring wall disposed above the substrate, a structure for transmitting high frequency signals into and out of the package assembly, comprising:

a lead via formed through the substrate and filled with a conductive material;

a conductive wire bond pad formed on the top surface of the substrate over the lead via and electrically connected thereto;

a conductive lead pad formed on the bottom surface of the substrate under the lead via and electrically connected thereto; and a lead mounted on the lead pad on the bottom surface of the substrate, the lead extending toward an edge of the substrate and passing under the seal ring wall, and a portion of the seal ring wall over the lead is thinner than other portions of the seal ring wall.

* * * * *